(12) United States Patent
Sogard

(10) Patent No.: US 7,323,698 B2
(45) Date of Patent: Jan. 29, 2008

(54) THERMALLY INSULATED THERMOPHORETIC PLATE

(75) Inventor: Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 542 days.

(21) Appl. No.: 10/967,123

(22) Filed: Oct. 19, 2004

(65) Prior Publication Data

US 2006/0082742 A1 Apr. 20, 2006

(51) Int. Cl.
*G03F 7/20* (2006.01)
(52) U.S. Cl. .................. 250/492.2; 355/30; 355/75
(58) Field of Classification Search .............. None
See application file for complete search history.

(56) References Cited

U.S. PATENT DOCUMENTS 6,153,044 A    11/2000   Klebanoff et al.
6,253,464 B1    7/2001   Klebanoff et al.
6,445,439 B1 *  9/2002   McCullough ............... 355/30

* cited by examiner

*Primary Examiner*—Jack I. Berman
(74) *Attorney, Agent, or Firm*—Greenblum & Bernstein, P.L.C.

(57) ABSTRACT

A subsystem for an exposure apparatus has a thermophoretic plate and at least one shielding layer covering a first surface of the thermophoretic plate. The at least one shielding layer controls thermally induced distortions of the exposure apparatus by reducing heat transfer between the exposure apparatus and the thermophoretic plate. The shielding layer includes an insulation layer and a reflective layer, where the reflective layer has a surface with a low emissivity. In one implementation, the reflective surface may be a surface of the thermophoretic plate. The reflective surface should be facing the exposure apparatus, but is not a requirement. More than one shielding layer may be used, in which each outermost shielding layer will have a higher temperature.

28 Claims, 7 Drawing Sheets

THERMALLY INSULATED THERMOPHORETIC PLATE

BACKGROUND OF THE INVENTION

1. Field of the Invention

The invention generally relates to a thermophoretic plate having a low emissivity surface and, more particularly, to a thermally insulated thermophoretic plate with a uniformly distributed emissivity surface used in a lithographic tool.

2. Background Description

A lithographic tool uses many components such as, for example, reticles and optical subsystems to ensure precise image transfer onto a wafer to produce a desired microelectronic device. But, the ability to produce high quality microelectronic devices and reduce yield losses is dependent upon maintaining the surfaces of critical components substantially defect-free. This would include, for example, maintaining the surfaces free of particulate matter, e.g., maintaining an ultra clean surface ensuring that particulate matter is not deposited on the surface of the wafer, the reticle or mask or other critical components. This is of particular concern as finer features are required on the microelectronic device.

The concern about defects caused by particle deposition onto surfaces is of particular importance for the next generation of lithography tools, for example, extreme ultraviolet (EUV) lithography. But, contamination from particulate matter is exacerbated since EUV lithography does not use a pellicle which is customarily employed to protect the reticles (masks) from particle deposition. A traditional pellicle cannot be used with EUV lithography for the following reasons, for example.

(i) A traditional pellicle would cause deleterious effects on the beam of high energy incident radiation used in the EUV lithography techniques. That is, for example, the pellicle may absorb some of the radiation, resulting in a loss of throughput.

(ii) A traditional pellicle made of organic material may decompose under the influence of high energy radiation, thus contributing to the deposition of particulate matter on the critical components.

In order to use EUV lithography effectively in the absence of a pellicle, it is important to devise alternative schemes for protecting the lithographic surfaces, e.g., critical components such as the reticles, from deposition of particulate matter. Some methods that have been devised to address particulate matter control on EUV components are debris shields through which the incoming EUV radiation is passed to catch or filter the particles, electrostatic fields, and thermophoresis.

Debris shields consist of a mesh or grid covered by a very thin film of material which is relatively transparent to EUV radiation, as well as being resistant to damage by the radiation. Zirconium thin films are an example of such material. The grid support allows the film to be very thin, thereby avoiding significant absorption of the EUV radiation. However the EUV radiation is absorbed by the grid, so the shield must be located far enough from the reticle that the shadows created by the grid are defocused in the reticle plane. This enables the illumination at the reticle to be uniform.

Debris shields are effective to a certain extent, but in an effort to maximize photon illumination, the "mesh" size has to be a compromise between particle pass-through rate and reduction in EUV power. The use of electrostatic fields, on the other hand, relies on the electric charge created on the particle by the presence of the EUV radiation. If the electrostatic field has a strong intensity gradient, uncharged particles may be deflected as well, but the force on the uncharged particle is quite weak. Thus, areas not illuminated by EUV radiation are substantially unprotected.

Thermophoresis represents a force on particles which relies on the presence of a thermal gradient in a gas between the reticle and a thermophoretic plate. In this technique, thermophoretic forces are capable of overcoming particle deposition due to, for example, electrostatic forces, inertia, gravity and other forces. The thermophoretic forces cause particles to be driven from regions of higher gas temperature to regions of lower gas temperature.

Thus, using the principles of thermophoresis, particles located between the reticle and thermophoretic plate are subject to the thermophoretic forces, pulling the particle away from the reticle, which is at a higher temperature than the thermophoretic plate. By using such a technique, the particles will not deposit on the reflective surface, e.g., reticle, and will not degrade the device or result in loss of yield. But, in currently explored thermophoretic systems, distortion of the exposure apparatus can occur due to expansion and contraction resulting from heat transfer throughout the system. In one particular instance, the apparatus may distort due to the temperature difference between the thermophoretic plate and the apparatus thus resulting in printing errors and yield loss.

SUMMARY OF THE INVENTION

In a first aspect of the invention, a subsystem for an exposure apparatus has a thermophoretic plate and at least one shielding layer covering a first surface of the thermophoretic plate. The at least one shielding layer controls thermally induced distortions of the exposure apparatus. In one implementation, this may be performed by reducing heat transfer between the exposure apparatus and the thermophoretic plate. The shielding layer includes an insulation layer and a reflective layer, where the reflective layer has a surface with a low emissivity. The reflective surface should be facing the apparatus, but is not a requirement. More than one shielding layer may be used, in which each outermost shielding layer will have a higher temperature.

In another aspect of the invention, the reflective surface may be a surface of the thermophoretic plate. In this aspect of the invention, the thermophoretic plate has a surface having a uniform emissivity to control thermally induced distortions of the reticle.

In another aspect of the invention, an exposure apparatus includes an illumination system that projects radiant energy on a reticle that is supported by and scanned using a reticle positioning stage. At least one linear motor positions the reticle positioning stage. A surface associated with the thermophoretic plate controls thermally induced distortions of the reticle. In aspects of the invention, the surface may be a separate shield or a surface of the thermophoretic plate. A device and/or a wafer on which an image has been formed may be manufactured with the exposure apparatus.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF EMBODIMENTS OF THE INVENTION

The invention is directed to, for example, a thermophoretic plate having a low emissivity surface to control thermal distortions of the exposure apparatus. In one exemplary embodiment, the invention relates to a thermally insulated thermophoretic plate used in a EUV (extreme ultraviolet) lithographic system. The use of the thermophoretic plate with a low emissivity surface or alternatively a thermally insulative thermophoretic plate with a surface of low emissivity will substantially control heat transfer within the system. This will, in turn, control and, in embodiments, substantially reduce thermal distortion effects caused by expansion and contraction which would otherwise reduce the performance of the EUV lithographic tool. As should be realized now, such distortion effects have been found to be a concern in precision systems.

Figure 1:
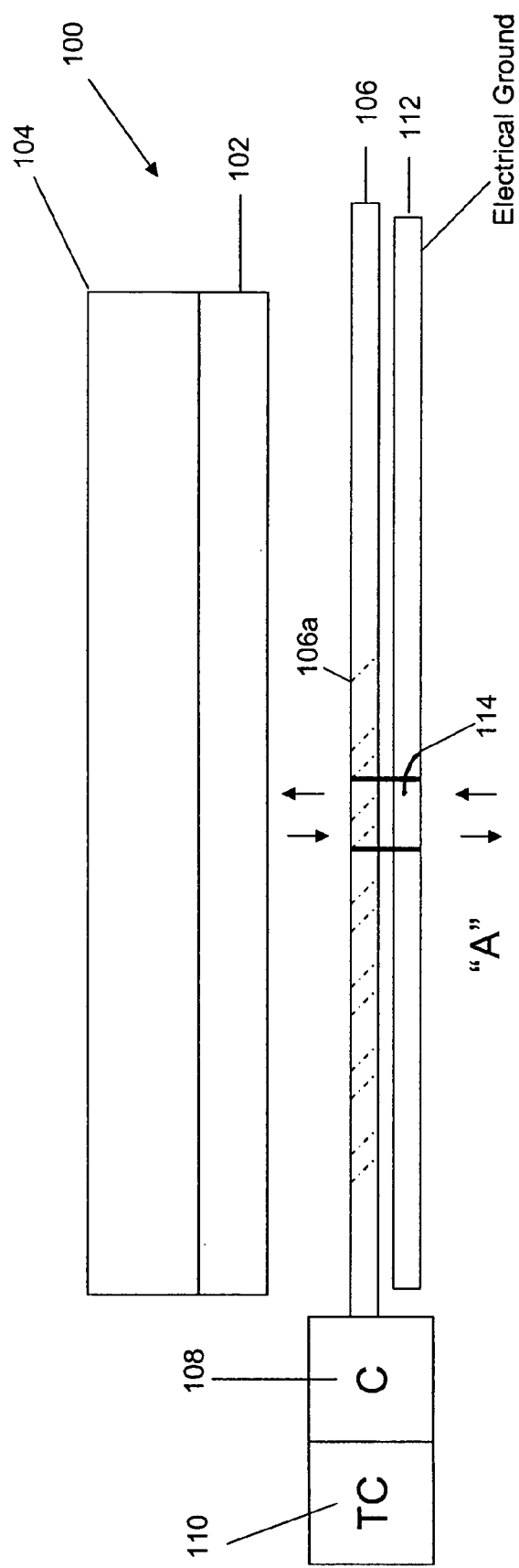
FIG. 1 shows a diagram of an embodiment in accordance with the invention.

FIG. 1 shows a subsystem of a lithographic tool. The subsystem is generally depicted as reference numeral 100 and includes a reticle 102 attached to a reticle chuck 104. In one embodiment, the lithographic system is a EUV lithographic system and the reticle 102 is a EUV reticle. A cooled plate (e.g., thermophoretic plate) 106 is in close proximity to the reticle 102, and in one implementation, is separated by a distance of about 3 mm to 20 mm. However, it should be understood by those of skill in the art that the distance between the reticle 102 and the thermophoretic plate 106 can vary from these distances in according with known design parameters. By using a thermophoretic plate, a thermophoretic force will exist which drives particles towards the cooler surface and away from the reticle or other critical surfaces such as a wafer.

The reticle 102 is nominally maintained at ambient temperature conditions and the thermophoretic plate 106 is at a cooler temperature than the surroundings. However, it is also contemplated that the reticle could be heated and the thermophoretic plate maintained at a lower temperature. In this manner, thermophoretic forces can be used to attract particles from a wafer in order to decrease printing errors. In one embodiment, the temperature difference between the thermophoretic plate 106 and the reticle 102 is between 5° K and 20° K, although other temperatures ranges are also contemplated by the invention. To provide this temperature differential, a thermoelectric cooler 108 is coupled to the thermophoretic plate 106. The thermoelectric cooler 108 may be controlled by any known temperature controller 110. In one embodiment, the thermophoretic plate 106 may be cooled by circulation of a coolant in internal channels 106a of the thermophoretic plate 106.

Still referring to FIG. 1, temperatures in precision tools such as a EUV lithography tool are typically maintained as uniformly as possible to avoid thermal expansion or contraction and distortion effects which can reduce the performance of the tool. In the EUV related tools, the use of the thermophoretic plate 106 may represent a perturbation of the system. That is, heat can transfer between the thermophoretic plate 106 and the surrounding structures by conduction through its supports, conduction between the thermophoretic plate 106 and its surroundings through the gas or by radiative heat transfer.

In the invention, however, the reduction of such perturbation is contemplated in order to increase the efficiency of the system and decrease yield loss. For example, the thermophoretic plate 106 and the thermoelectric cooler 108 are preferably isolated, as much as possible, from thermal conduction to the surroundings. This isolation may be performed by using a thermal insulator layer. Isolation from radioactive heat transfer may be accomplished, for example, by adjusting the emissivity of the surfaces or alternatively covering the components with a lower emissivity surface so that heat transfer is reduced. Additionally, there is some conduction through the residual gas which is required for thermophoresis. This conduction can be reduced by maintaining as large a distance as possible with the surroundings within design parameters.

Additionally, the perturbation may also be reduced by providing the thermophoretic plate 106 with a low emissivity surface, preferably on the order of 0.05, for example. This surface may be any reflective surface which would reduce the emissivity of the thermophoretic plate 106 such as a highly reflective metal surface. This lower emissivity surface will reduce the radiative heat transfer between the thermophoretic plate 106 and the reticle 102 thus reducing distortion effects due to thermal contraction and expansion. In other words, the lower emissivity surface is design to control the thermal distortions known to exist of the EUV reticle in EUV lithographic tools.

Figure 2:
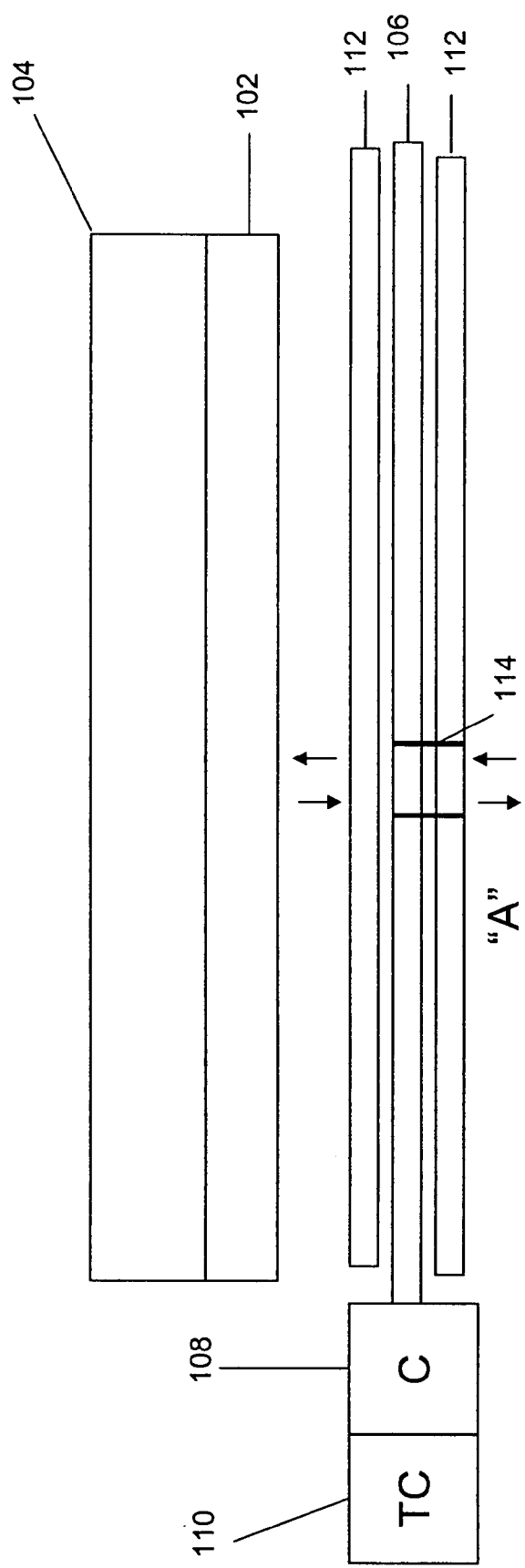
FIG. 2 shows a diagram of another embodiment in accordance with the invention.

To further, or alternatively, reduce the perturbation, shielding of the thermophoretic plate 106 is contemplated by the invention. In one embodiment, the shielding is a thermal radiation insulation depicted as reference numeral 112, facing away from the reticle face. The shielding, in one exemplary embodiment, may also face the reticle 102 or be provided on both sides of the reticle 102, as shown in FIG. 2. A hole 114 may be provided in the thermophoretic plate 106 and thermal radiation insulation 112 in order to allow illumination of the reticle; that is, the hole will allow EUV radiation to reflect from the reticle and through the optics as represented by arrows labeled "A" shown in FIGS. 1 and 2.

The thermal radiation insulation 112 may be one or more sheets having a thermal insulator and a surface with a low thermal emissivity. In preferred embodiments, the emissivity is uniform throughout exposed the surface. By having a low thermal emissivity, as discussed in more detail below, relatively little heat is radiated to the surroundings thus reducing the perturbation of the thermophoretic plate 106. Minimizing the mass of the thermal radiation insulation also reduces their heat capacity, so relatively little heat from the thermal radiation insulation is conducted to their supports in the system. This may be accomplished by minimizing the thickness of the shielding, itself, as discuss with reference to FIG. 3.

In one exemplary embodiment, the thermal radiation insulation layers 112 (referred alternatively as shields) are thermally insulated from one another so that they can adjust their temperatures to equilibrate thermal radiation between the shields. Also, the thermal radiation insulation 112 should be electrically grounded since they are bombarded with photoelectrons as well as EUV radiation which can charge the insulator.

Figure 3:
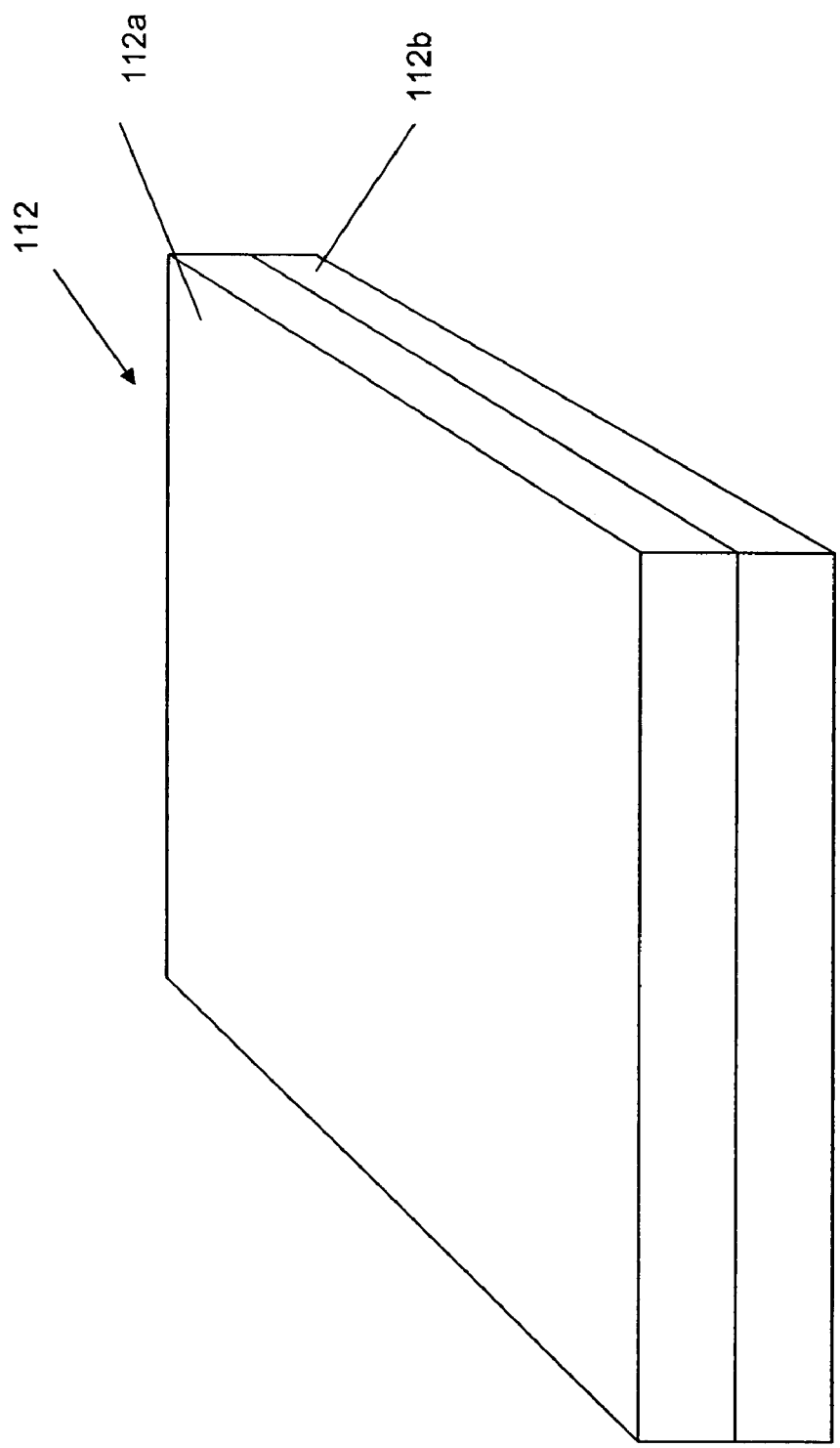
FIG. 3 shows a thermal insulation used in accordance with the invention.

Referring to FIG. 3, in one implementation, the thermal radiation insulation includes two layers: an insulation layer 112a and a surface 112b with a low and uniform emissivity throughout the exposed surface such as a polished metal or other reflective or shiny surface. Although not critical to the understanding of the invention, the surface 112b should preferably be facing the surroundings.

In one embodiment, the thermal radiation insulation 112 is aluminized Mylar®; however, it should be understood that any insulation material with a surface having a low emissivity may be used with the invention. In choosing an insulation material, consideration should be given to an appropriate plastic material which does not outgas, e.g., contaminate critical surfaces such as the reticle and optical surfaces. In addition, the insulation material should be relatively transparent to thermal radiation. At room temperature the thermal radiation spectrum lies primarily in the near infrared and mid-infrared regimes. In one exemplary embodiment, the surface with a low emissivity has a thickness in the range of 10 nm to 100 nm, although other thicknesses are also contemplated for use by the invention. Also, in one exemplary embodiment, the thickness of the insulation may range between 5 microns and 15 microns, and preferably less than 25 microns. Although, again, the thickness of the insulation material may be provided between different ranges depending on the number of sheets, the design parameters of the system and the like.

If more than one shield is used in the system, it is preferable to layer the shields in an alternating pattern. For example, in a two shield application, the following layered sequence may be used:
  (i) With the first shield, layer 112a lays on the thermophoretic plate and layer 112b faces outwards (towards the surroundings); and
  (ii) With the second shield, layer 112a lies on the layer 112b of the first shield and layer 112b (of the second shield) faces the surroundings.

Thus, in this exemplary application, the insulation layer 112a is contacting the thermophoretic plate 106. Also, the surface with the lower emissivity (layer 112b) is facing the surrounding in order to reduce the heat transfer to the surroundings. It should be appreciated by those of skill in the art, that other arrangements are also contemplated by the invention.

The temperature of the outer surface 112b of the thermal radiation insulation 112 is designed to be closer to ambient temperature than the thermophoretic plate so convection as well as thermal radiation is thus reduced. In this way, the radiative insulators effectively reduce the amount of heat transferred to the surrounding surfaces. This is discussed in more detail with reference to FIG. 4.

By way of one illustrative non limiting example, the operation of the thermal radiation insulation will be described with the following model. Heat transfer to the surroundings in general is quite complicated since the geometries and thermal emissivities of all the surfaces must be considered. For simplicity and illustration, the surroundings are treated as another nearby surface parallel to the thermophoretic plate 106 with average emissivity $e_s$ and temperature $T_s$. The emissivity and temperature of the thermophoretic plate are $e_t$ and $T_t$. The radiative heat transfer per unit area between the two surfaces is then:

$$E_{st} = \sigma(T_s^4 - T_t^4)/[1/e_s + 1/e_t - 1] \quad (1)$$

This value can be minimized if $e_s$ and $e_t$ are very small, e.g., approximately 0.05, such as by using a polished or reflective surface. This polished or reflective surface is preferably a metal surface.

As discussed, the thermophoretic plate 106 should have as small a value of $e_t$ as possible to minimize heat transfer from the reticle 102. This can be accomplished by providing a polished metal surface. But, it may not be possible to make $e_s$ small, because of other requirements for the surrounding structures such as the use of glass or ceramics or the requirement or need of a roughened surface. Therefore, further reduction in heat transfer can be achieved by adding additional shields.

The effect of thermal shields is analyzed below. In the following, the effects of the insulation layers 112a and thermal conduction are ignored. If there are "n" identical shields separating the thermophoretic plate 106 and the surroundings, each with emissivity "e", a series of heat transfer equations between adjacent surfaces can be written as follows:

$$E_{s1} = \sigma(T_s^4 - T_1^4)/[1/e_s + 1/e - 1] \quad (2)$$
$$E_{12} = \sigma(T_1^4 - T_2^4)/[2/e - 1]$$
$$E_{23} = \sigma(T_2^4 - T_3^4)/[2/e - 1]$$
$$\ldots$$
$$E_{n-1n} = \sigma(T_{n-1}^4 - T_n^4)/[2/e - 1]$$
$$E_{nt} = \sigma(T_n^4 - T_t^4)/[1/e + 1/e_t - 1].$$

In thermal equilibrium, $$E_{s1} = E_{12} = E_{23} = \ldots E_{n-1n} = E_{nt} \quad (3)$$

Combining the first n equations gives the relation $$(A_s - 1)T_1^4 + (nA_t + 1)T_n^4 = nA_t T_t^4 + A_s T_s^4 \quad (4)$$

Equating the first and last equations gives $$A_s T_1^4 + A_t T_n^4 = A_t T_t^4 + A_s T_s^4, \quad (5)$$

where $$A_s = (1/e_s + 1/e - 1)/(2/e - 1) \quad (6)$$

$$A_t = (1/e_t + 1/e - 1)/(2/e - 1).$$

Equations (4) and (5) can then be solved for $T_t^4$ and $T_n^4$, as follows:

$$T_1^4 = (A_t T_t^4 + A_s(1 + (n-1)A_t)T_s^4)/(A_t + A_s(1 + (n-1)A_t)). \quad (7)$$

Substituting into the first of Equation (2) gives the heat transfer from the surroundings as:

$$E_{s1} = \sigma A_s(T_s^4 - T_t^4)/[(A_t + A_s(1+(n-1)A_t))(1/e_s + 1/e - 1)]. \quad (8)$$

The "n" in the denominator shows that additional layers of insulation will reduce the heat transfer beyond that of a single layer. This can be seen more clearly in the following illustrative examples.

EXAMPLE 1

In a first example, when e<<1, $e_s$ and $e_t$ not necessarily small. Then $A_s = A_t = \frac{1}{2}$, and Equations (7) and (8) reduce to:

$$T_1^4 = (2T_t^4 + (n+1)T_s^4)/(n+3), \quad (9)$$

and $$E_{s1}=2\sigma e(T_s^4-T_t^4)/(n+3)$$

EXAMPLE 2

In this second example, when $e_s=e_t=e<<1$, then $A_s=A_t=1$, and $$T_1^4=(T_t^4+nT_s^4)/(n+1), \qquad (10)$$

and $$E_{s1}=\sigma e(T_s^4-T_t^4)/(2(n+1)).$$

As should now be understood, in the case of a small e and large n, heat transfer from the surroundings decreases proportionally as 1/n. And, if both $e_t$ and $e_s$ are also small (comparable to "e") the heat transfer is reduced by another factor of approximately 14. The temperature $T_1$ also approaches $T_s$, so convective as well as radiative heat transfer is also reduced.

Figure 4:
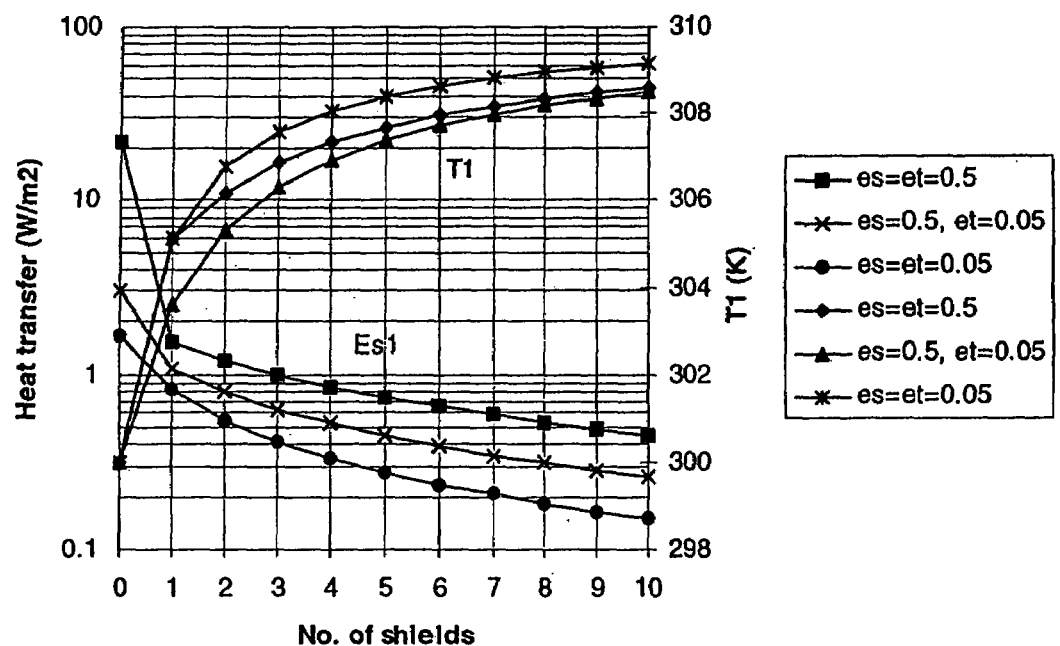
FIG. 4 is a graph showing heat transfer and temperature dependencies as a function of emissivity and number of shields used in accordance with the invention.

FIG. 4 shows the radiative heat transfer and temperature $T_1$ dependence as a function of emissivity and number of shields. $T_1$ is the temperature of the shield adjacent to the surroundings. In this case $T_1=300°$ K and $T_s=310°$ K. For the case of $e_s=e_t=0.5$, a single shield with emissivity of 0.05 can reduce the heat transfer by a factor of 4. The resulting heat transfer is smaller than the unshielded case even if the emissivities of both the thermophoretic plate and surroundings are reduced to 0.05. In addition, the temperature difference between the thermal radiation insulation 112 and surroundings is significantly reduced, reducing convective heat transfer from the surroundings. Additional shields improve the situation further by reducing the effective $e_s$ (emissivity) of the system, as discussed throughout.

In the example of FIG. 4, "0" represents the case of no shields or thermal radiation insulation layers. In this example, the radiative heat transfer is approximately 1.6 watts/meter$^2$ (W/m$^2$). By adding one shield with a surface having an emissivity of 0.05, the heat transfer is reduced to about 0.8 W/m$^2$, which is a reduction of a factor of about 2. By adding a second shield with a surface having an emissivity of 0.05, the heat transfer is further reduced to approximately 0.55 W/m$^2$. By adding even more shields, the heat transfer is reduced even further as shown by the curves below the designation "Es1". As represented by Equation (10), which is an approximation for when "e" is small, the heat transfer will continue to decrease. As FIG. 4 shows, substantial reduction of radiative heat transfer also occurs for values of $e_s$ or $e_t$ greater than 0.05.

Also, it should be understood that with no shields, the temperature of the thermophoretic plate 112 will be approximately 300° K. But, the layer 112b has a floating temperature which seeks equilibrium. Thus, as shown in FIG. 4 by the curves above the designation $T_1$, the temperature of the outermost shield increases as more shields are added until the outermost shield reaches approximately 310° K. In this example, the temperature of the reticle is also at about 310° K. Thus, it is shown in FIG. 4 that the net heat transfer is related to the difference in $T_1$ and the outer shield and surroundings. In Equation (10) as n (number of shields) goes to infinity $T_1$ goes to Ts.

Figure 5:
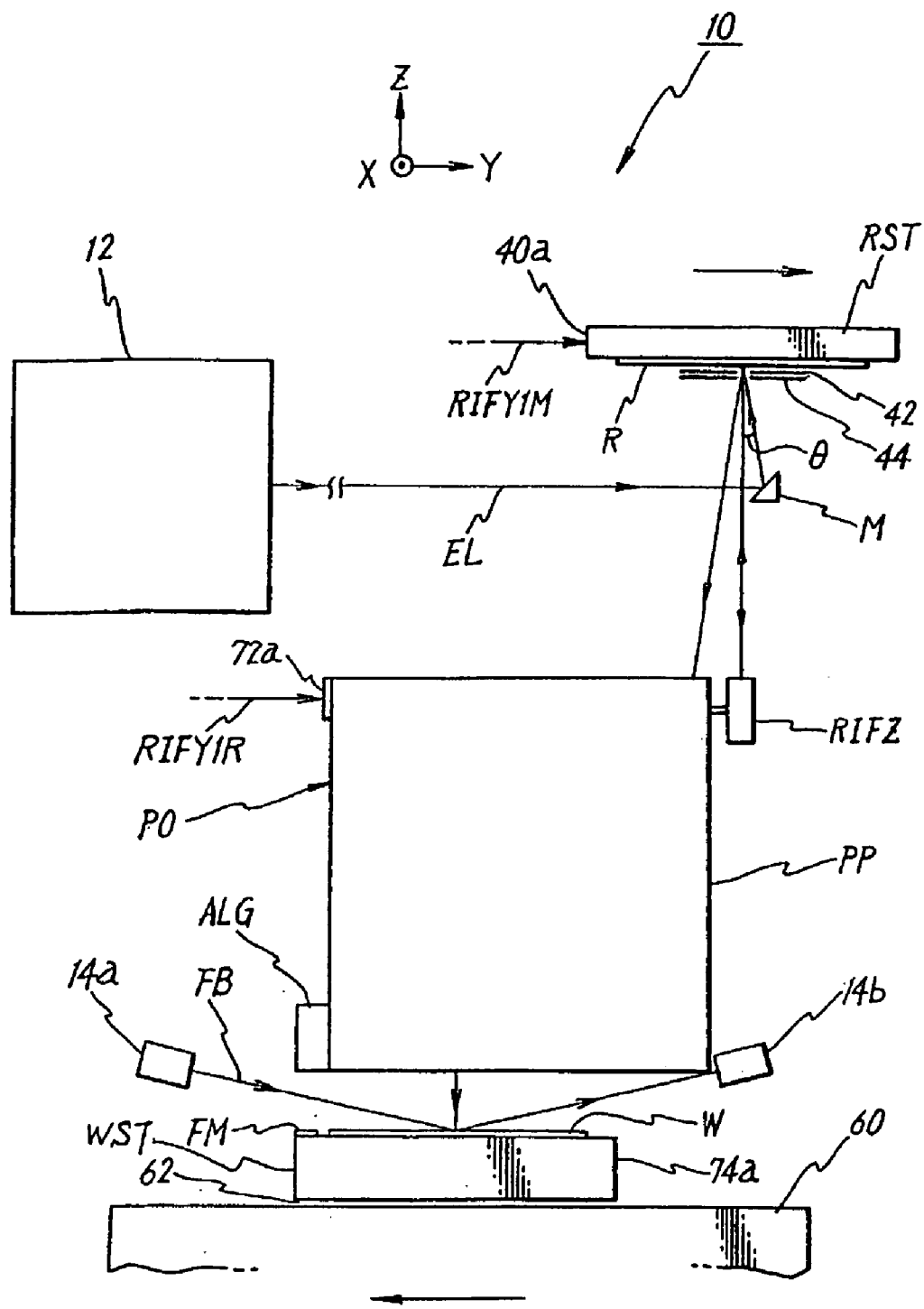
FIG. 5 is a schematic view illustrating a photolithography apparatus according to the invention.

FIG. 5 is a schematic view illustrating a general structure of an exposure apparatus 10 according to the embodiment of the invention. The exposure apparatus 10 is a projection exposure apparatus designed to perform exposure operations by the step-and-scan method using light (EUV light) in the soft X-ray region with a wavelength from 5 nm to 15 nm as the exposure illumination light EL. In this embodiment, as will be described later, a projection optical system PO for vertically projecting the reflected light beam from a reticle R as a mask onto a wafer W is used. The projecting direction, therefore, of the illumination light EL projected from the projection optical system PO onto the wafer W, will hereinafter be referred to as the optical axis direction of the projection optical system PO. This optical axis direction will be defined as the Z-axis direction; the Y-axis direction being the lateral direction within the drawing surface of FIG. 5 in a plane perpendicular to the Z-axis direction; and the X-axis direction being a direction perpendicular to the drawing surface.

The exposure apparatus 10 projects through the projection optical system PO, an image of a part of the circuit pattern drawn on the reflection type reticle R serving as a mask onto a wafer W serving as a substrate, while relatively scanning the reticle R and the wafer W in a linear direction (Y-axis direction in this case) in respect to the projection optical system PO. The entire circuit pattern of the reticle R is thus transferred respectively onto a plurality of shot areas on the wafer W by the step-and-scan method.

The exposure apparatus 10 comprises a light source unit 12 for horizontally emitting EUV light EL along the Y direction, a deflection mirror M (part of an illumination optical system) for reflecting the EUV light EL from the light source unit 12 and bending its optical path to make the light incident on the pattern surface (lower surface in FIG. 5) of the reticle R at a predetermined incident angle .theta. (.theta. is about 50 mrad in this case), a reticle stage RST serving as a mask stage for holding the reticle R, the projection optical system PO made up of a reflection optical system which irradiates the EUV light EL reflected on the pattern surface of the reticle R in a direction perpendicular to the exposing surface of the wafer W, a wafer stage WST serving as a substrate stage for holding the wafer W, focus sensors (14a and 14b), and an alignment optical system ALG serving as a mark detection system.

The exposure apparatus of FIG. 5 may be used to manufacture a device. Additionally, the exposure apparatus may be used for form a wafer on which an image has been formed.

Figure 6:
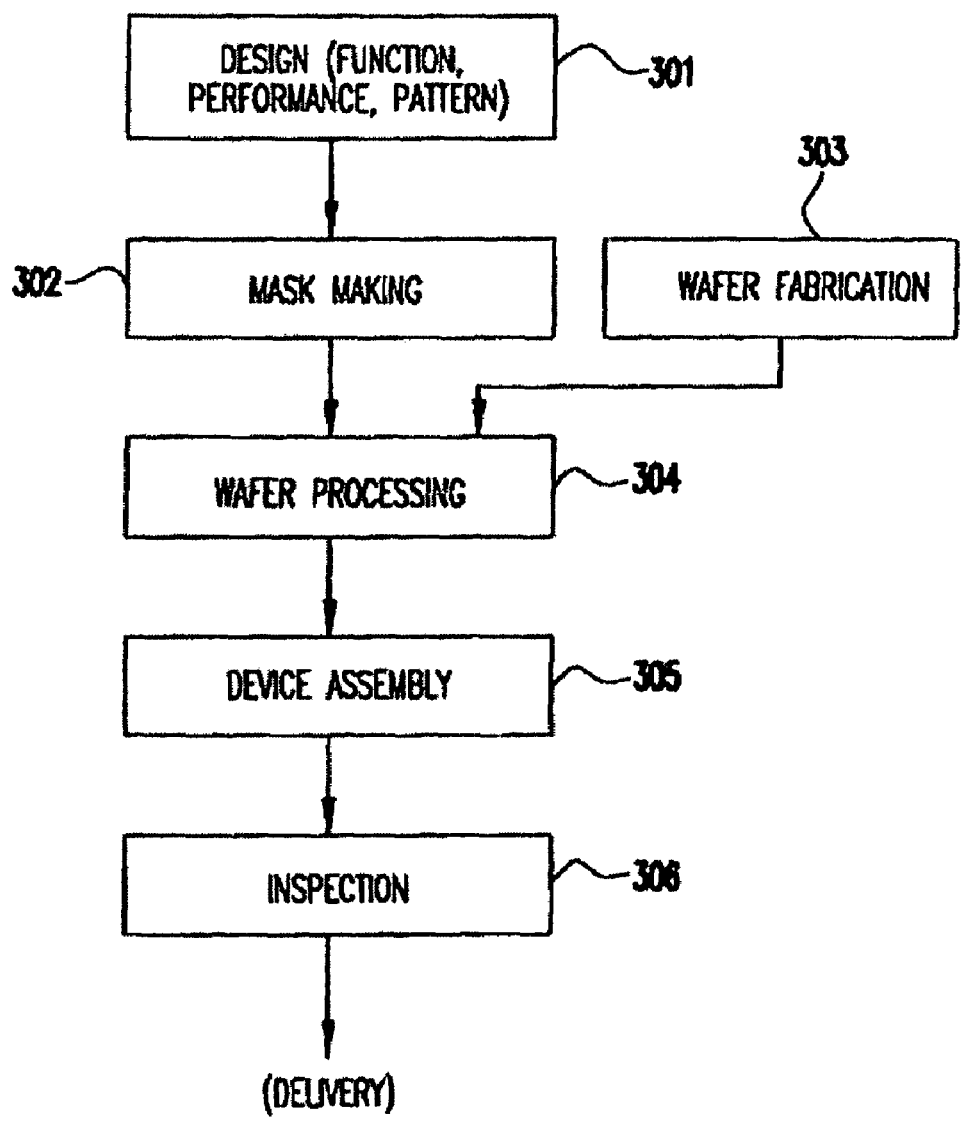
FIG. 6 shows a flow chart of manufacturing device.

Further, semiconductor devices can be fabricated using the above described systems, by the process shown generally in FIG. 6. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 7:
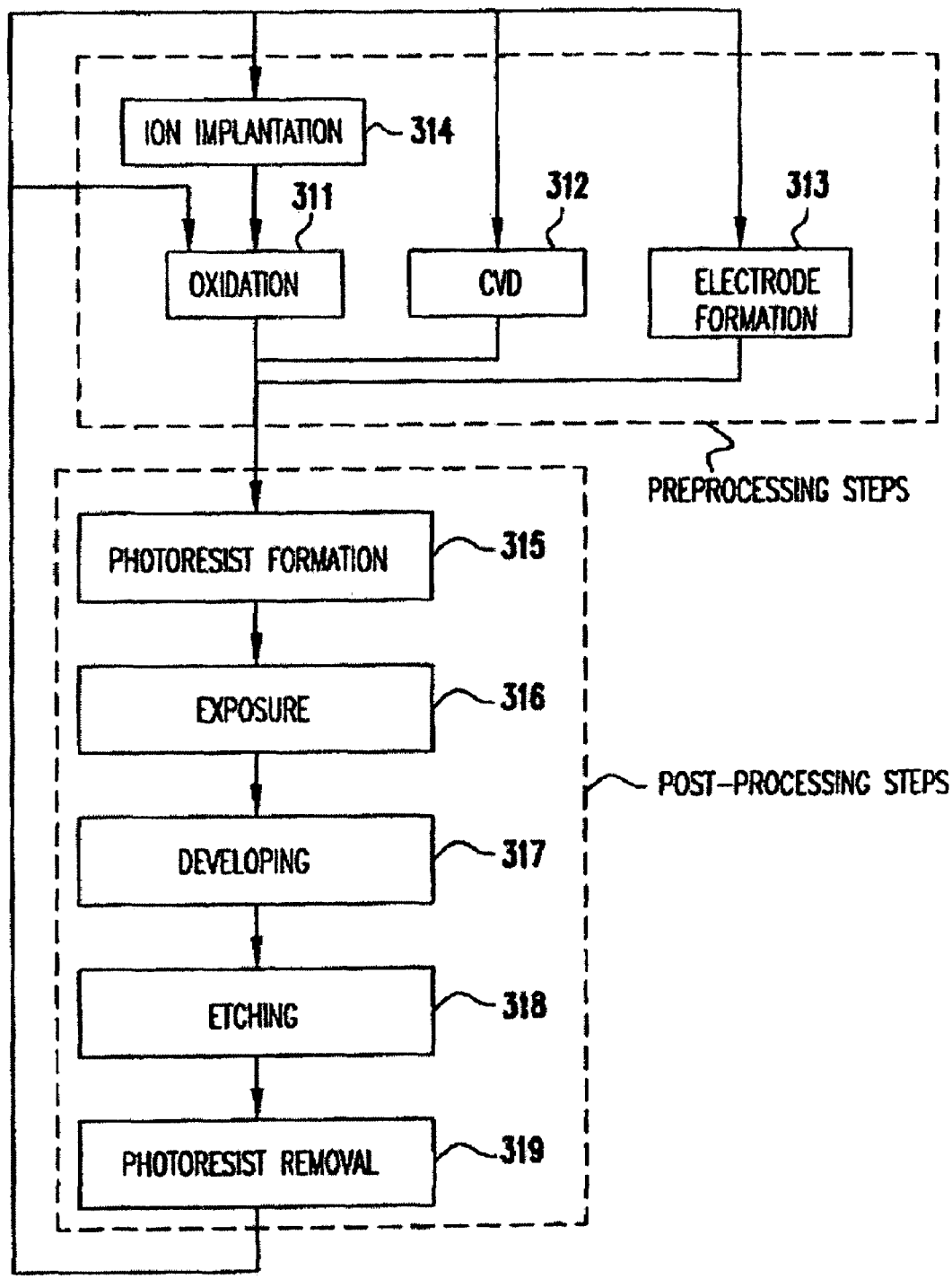
FIG. 7 shows a flow chart of manufacturing a device.

FIG. 7 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above-mentioned steps 311-314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially in step 315 (photoresist formation step), photoresist is applied to a wafer. Next, in step 316 (exposure step), the above-mentioned exposure apparatus is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these pre-processing and post-processing steps.

Although the invention has been particularly discussed in a photolithography system as an exemplary example, the inventive products, methods and systems may be used in other and further contexts, including any applications where it is desired to reduce or minimize vibrations, such as precision apparatuses (e.g., photography systems).

While the invention has been described in terms of embodiments, those skilled in the art will recognize that the invention can be practiced with modification within the spirit and scope of the appended claims.

The invention claimed is:

1. A subsystem for an apparatus, comprising
a thermophoretic plate; and
at least one shielding layer covering a first surface of the thermophoretic plate, the at least one shielding layer controlling thermally induced distortions of an apparatus.

2. The subsystem of claim 1, wherein the at least one shielding layer includes an insulation layer and a reflective layer.

3. The subsystem of claim 2, wherein the reflective layer has a surface with an emissivity of about 0.05.

4. The subsystem of claim 2, wherein the insulation layer is covering the surface of the thermophoretic plate and the reflective layer is facing the surroundings.

5. The subsystem of claim 1, wherein the at least one shielding layer includes an insulation layer and a reflective layer having a surface with an emissivity lower than the thermophoretic plate.

6. The subsystem of claim 5, wherein the emissivity of the reflective layer is substantially uniform.

7. The subsystem of claim 1, wherein a layer of the at least one shielding layer is closer to ambient temperature than the thermophoretic plate.

8. The subsystem of claim 1, wherein the at least one shielding layer is "n" shielding layers and each of the "n" shielding layers reduces the heat transfer properties beyond that of a single layer of the at least one shielding layer.

9. The subsystem of claim 1, wherein the temperature of an outermost shielding layer of the at least one shielding layer increases as more shields are provided over the thermophoretic plate.

10. The subsystem of claim 1, wherein the thermophoretic plate and the surroundings have an emissivity higher than the emissivity of an outward facing surface of the at least one shielding layer.

11. The subsystem of claim 1, wherein the at least one shielding layer is electrically grounded.

12. The subsystem of claim 1, wherein the at least one shielding layer includes a layer of insulation material having a thickness in a range of 10 nm to 100 nm and a reflective surface having a thickness of less than about 25 microns.

13. The subsystem of claim 1, further comprising:
a cooler connecting to the thermophoretic plate to provide a thermal gradient between the thermophoretic plate and a reticle; and
a temperature controller associated with at least one of the thermophoretic plate and the reticle to control the temperature,
wherein a distance between the reticle and the thermophoretic plate is approximately 3 mm to 20 mm.

14. A subsystem for an apparatus comprising a thermophoretic plate having a first surface facing the apparatus, the first surface having a uniform emissivity to control thermally induced distortions of the apparatus.

15. The subsystem of claim 14, wherein the first surface is a shielding layer having a reflective surface.

16. The subsystem of claim 15, wherein the shielding layer has an insulator material facing the thermophoretic plate and the reflective surface is the facing surface.

17. The subsystem of claim 14, wherein the emissivity of the first surface controls thermally induced distortions of the apparatus by reducing heat transfer between the thermophoretic plate and the apparatus.

18. An exposure apparatus, comprising:
an illumination system that projects radiant energy on a reticle that is supported by and scanned using a wafer positioning stage;
at least one linear motor that positions the wafer positioning stage;
a thermophoretic plate having a surface facing the reticle; and
a surface associated with the thermophoretic plate which controls thermally induced distortions of the exposure apparatus.

19. A device manufactured with the exposure apparatus of claim 18.

20. A wafer on which an image has been formed by the exposure apparatus of claim 18.

21. The exposure apparatus of claim 18, wherein the surface is a shielding layer facing the exposure apparatus.

22. The exposure apparatus of claim 21, wherein the shielding layer includes an insulation layer and a reflective layer, the reflective layer having an emissivity lower than a surrounding area.

23. The exposure apparatus of claim 22, wherein the insulation layer is covering the surface of the thermophoretic plate and the reflective layer is facing the surroundings.

24. The exposure apparatus of claim 22, wherein the shielding layer reduces heat transfer between the exposure apparatus and the thermophoretic plate.

25. The exposure apparatus of claim 18, wherein a layer of the shielding layer is closer to ambient temperature than the thermophoretic plate to reduce heat transfer.

26. The exposure apparatus of claim 21, wherein the thermophoretic plate and the surroundings have an emissivity higher than a surface of the shielding layer facing the exposure apparatus.

27. The exposure apparatus of claim 22, wherein the shielding layer is electrically grounded.

28. The exposure apparatus of claim 18, wherein an emissivity of the surface is uniform.

* * * * *